United States Patent
Plöger et al.

(10) Patent No.: US 12,438,537 B2
(45) Date of Patent: Oct. 7, 2025

(54) POWER SUPPLY DEVICE AND METHOD FOR CHECKING A FIELD EFFECT TRANSISTOR OF SUCH A POWER SUPPLY DEVICE

(71) Applicant: Weidmüller Interface GmbH & Co. KG, Detmold (DE)

(72) Inventors: Matthias Plöger, Lemgo (DE); Michael Buschkamp, Lage (DE); Klaus Schürmann, Lage (DE); Tobias Blome, Blomberg (DE)

(73) Assignee: Weidmüller Interface GmbH & Co. KG (DE)

( * ) Notice: Subject to any disclaimer, the term of this patent is extended or adjusted under 35 U.S.C. 154(b) by 397 days.

(21) Appl. No.: 18/247,809

(22) PCT Filed: Oct. 1, 2021

(86) PCT No.: PCT/EP2021/077149
§ 371 (c)(1),
(2) Date: Oct. 24, 2023

(87) PCT Pub. No.: WO2022/073883
PCT Pub. Date: Apr. 14, 2022

(65) Prior Publication Data
US 2024/0056070 A1  Feb. 15, 2024

(30) Foreign Application Priority Data
Oct. 5, 2020  (DE) .......................... 102020126016.4

(51) Int. Cl.
*H03K 17/18* (2006.01)
*H02M 1/32* (2007.01)
*H03K 17/30* (2006.01)

(52) U.S. Cl.
CPC .............. *H03K 17/18* (2013.01); *H02M 1/32* (2013.01); *H03K 2017/307* (2013.01)

(58) Field of Classification Search
CPC ........ H03K 17/18; H03K 17/20; H03K 17/22; H03K 17/223; H03K 2017/307;
(Continued)

(56) References Cited

U.S. PATENT DOCUMENTS

| 7,038,433 B2 | 5/2006 | Fan et al. |
| 2002/0039034 A1* | 4/2002 | Kohda ................. H03K 17/693 326/123 |

(Continued)

FOREIGN PATENT DOCUMENTS

| EP | 1863176 A1 | 12/2007 |
| WO | 2005020286 A2 | 3/2005 |

*Primary Examiner* — Nguyen Tran
(74) *Attorney, Agent, or Firm* — LAUBSCHER & FRETWELL, P.C.

(57) ABSTRACT

The invention relates to a method for checking at least one field effect transistor (11) connected as an active diode, which is connected downstream of an output of a power supply unit (1) within a power supply device. The method comprises the following steps:

- generating a not fully conducting, in particular blocking state of the at least one field effect transistor (11);
- detecting a first value of a voltage drop ($\Delta U$) across a switching path of the at least one field effect transistor (11) at a first set voltage of the power supply unit (1);
- setting a second voltage of the power supply unit (1);
- detecting a second value of the voltage drop ($\Delta U$) across the switching path of the at least one field effect transistor (11) at the second set voltage of the power supply unit (1);
- detecting and signaling a defect of the at least one field effect transistor (11) if the first value of the voltage drop ($\Delta U$) and the second value of the voltage drop ($\Delta U$) are (Continued)

both smaller in magnitude than a predetermined first positive threshold value ($U_1$), or if the first value of the voltage drop ($\Delta U$) and/or the second value of the voltage drop ($\Delta U$) are larger than a predetermined second positive threshold value ($U_n$), wherein the second threshold value is larger than the first threshold value.

The invention further relates to a power supply device having a power supply unit (1) downstream of which at least one field effect transistor (11) connected as an active diode is connected.

17 Claims, 3 Drawing Sheets

(58) Field of Classification Search
CPC ........ H03K 2017/30; H03K 2017/302; H02M 1/32; H02M 1/322; H02M 1/325; H02M 1/16; H02M 1/20
See application file for complete search history.

(56) References Cited

U.S. PATENT DOCUMENTS

| | | | |
|---|---|---|---|
| 2007/0081371 A1* | 4/2007 | Wittenbreder, Jr. ... | H03K 17/04 |
| | | | 363/127 |
| 2008/0030263 A1 | 2/2008 | Frederick et al. | |
| 2013/0181729 A1 | 7/2013 | Egan et al. | |
| 2019/0052255 A1* | 2/2019 | Guo .................. | H03K 17/0403 |

* cited by examiner

POWER SUPPLY DEVICE AND METHOD FOR CHECKING A FIELD EFFECT TRANSISTOR OF SUCH A POWER SUPPLY DEVICE

This application is a § 371 National Stage Entry of International Patent Application No. PCT/IB2021/077149 filed Oct. 1, 2021 which claims priority of Patent Application No. DE 10 2020 126016.4 filed Oct. 5, 2020. The entire content of these applications is incorporated herein by reference.

BACKGROUND OF THE INVENTION

The invention relates to a power supply device having a power supply unit downstream of which at least one field effect transistor is actively connected as an active diode. The invention further relates to a method for checking at least one field effect transistor connected as an active diode in a power supply device.

BRIEF DESCRIPTION OF THE PRIOR ART

To prevent reverse currents in power supply devices, a diode is usually connected in series with the connected load. Such a diode is of particular importance when two or more power supply devices are connected in parallel with their outputs to supply a load. Supplying a load from power supply devices connected in parallel is used in practice, for example, when a higher current is required than a single power supply device available can supply. Another reason can be a desired redundant supply, by which a load can be operated safely even if one of the power supply devices fails.

Frequently, the diode mentioned is already arranged within a power supply device. It is then connected downstream of the actual power supply unit that builds up the output voltage and provides the output current. Because of the described functionality that in case of parallel connected power supply devices the one and/or the other can supply the load, the diode is also called an "ORing diode".

Since these ORing diodes are in the power path of the load, they carry all of the current provided by the power supply device. With a voltage drop of about 0.7 volts (V) in the forward direction of a silicon diode, this results in not insignificant power losses for power supply devices with a higher output current of some 10 amps (A).

In order to reduce these power losses, it is known to use, instead of a passive silicon diode, one or more switched field effect transistor(s) (FET) provided with an additional drive circuit, which in turn can be dependent on the level of a voltage applied to the output of the power supply device relative to the set output voltage of the power supply unit. If a suitable field effect transistor, in particular a MOSFET transistor (metal oxide FET) is used, contact resistances in the range of milliohms can be achieved in the conducting state, whereby the voltage drop can be reduced to a few millivolts (mV) or a few 10 mV and the power dissipation can be reduced accordingly, while, with suitable driving, the function of a diode is simultaneously provided.

Particularly in the case of power supply devices intended for redundant use, a check of the correct function of the field effect transistor is desired and useful in this context in order to guarantee the redundancy of the power supply. If, for example, a permanently conducting field effect transistor means that the power supply devices are no longer decoupled from each other, a failure of one power supply device could also affect the others.

A drive circuit for a field effect transistor for use as an active diode is described in U.S. Pat. No. 7,038,433 B2. In addition to the function for driving the field effect transistor to achieve the active diode function, the circuit includes a test circuit which outputs a warning signal if a voltage drop across its switching path falls below a predetermined value despite the field effect transistor being switched off. A voltage drop that is too small is considered to indicate that the transistor's switching path has fused and has a permanently low resistance.

The described method provides reliable results for a power supply device running in single operation. However, in the case of parallel operation of at least two power supply devices connected together on the output side, a measured voltage drop that is below the threshold value can also have its origin in the fact that the voltages provided by both power supply devices match in their level to such an extent that no voltage drop can be measured. In this case, a defective ORing FET would be incorrectly inferred.

SUMMARY OF THE INVENTION

It is therefore an object of the present invention to describe a test method for such an ORing FET which provides reliable test results and excludes the possibility that a field effect transistor which is actually functioning correctly is detected as defective. It is a further object to provide a power supply device which is arranged to carry out such a test method.

A method according to the invention for checking at least one field effect transistor connected as an active diode, which is connected downstream of an output of a power supply unit within a power supply device, has the following steps according to the invention. A non-fully conducting, in particular blocking, state of the transistor is set and a first value of a voltage drop across a switching path of the field effect transistor is measured at a first set voltage of the power supply unit. Subsequently, a second voltage of the power supply unit deviating from the first voltage is set, and a second value of the voltage drop across the switching path of the field effect transistor is measured at this second voltage. A defect of the field effect transistor is detected and signaled if the first value of the first voltage drop and the second value of the voltage drop are both smaller in magnitude than a predetermined positive first threshold value, or if the first value of the voltage drop and/or the second value of the voltage drop are larger than a predetermined second positive threshold value, wherein the second threshold value is larger than the first threshold value.

If the value of the voltage drop is between the first and second thresholds, it indicates commutation of the load current from the switching path to a body diode. The body diode is an intrinsic diode of the field effect transistor connected in parallel with the switching path. In its forward direction, the body diode takes a current flow even if the field effect transistor is not conducting. As a rule, a switching transistor used as an active diode in power supply devices is arranged just so that the body diode has an ORing function, but then with the silicon diode-typical voltage drop of e.g. about 0.7 V and not with the advantageous smaller voltage drop that can be achieved with a conductively connected field effect transistor.

Even if in the context of this application reference is made to one or the field effect transistor, this also refers to an arrangement of several synchronously driven transistors. With respect to their switching distance, field effect transistors connected in parallel can be used to achieve a higher current-carrying capacity. With regard to their switching distance, serially connected field effect transistors can be used to achieve a safer switching behavior.

Instead of or in addition to an intrinsic body diode, a diode arranged externally to the field effect transistor, in particular a Schottky diode, can also be used. An arrangement with a field effect transistor which has no intrinsic diode and to which no external diode is assigned can also be checked with the method according to the invention, optionally with an adapted level of the threshold values.

The threshold values can be set, for example, to 0.3 V and 2 V, in particular for checking an arrangement with an intrinsic or external diode connected in parallel with the field effect transistor. If the second condition mentioned is met in one of the two measurements, it means that the field effect transistor is blocking as desired, but its body diode is also not conducting. This is a rare but possible failure case that is detected in this way. In an advantageous design of the method, the first threshold value is about 0.3 V. Further advantageously, the second threshold value is at least about 1.5 V, in particular about 2V.

If the voltage drop in the first measurement does not exceed the first threshold value, this may be due to a short circuit in the switching path of the field effect transistor. However, a transfer of the current to the body diode may also not have occurred because a voltage is maintained externally at the output, e.g. by another power supply device connected in parallel. However, changing the nominal voltage before the second voltage drop measurement will result in different output voltages from the power supply devices involved. If the field effect transistor has then switched off correctly and the load current is commutated to the body diode, this is reflected in a correspondingly large voltage difference. However, if no voltage drop above the first threshold value is measured in this second measurement either, a defective field effect transistor can be detected and signaled according to the invention.

The power supply unit of a power supply device according to the invention can be, for example, an alternating current/direct current (AC/DC) converter, often also referred to as a power supply unit. In the context of the application, the term power supply unit also includes, but is not limited to, DC/DC converters and battery and buffer modules for uninterruptible power supply.

In an advantageous design of the method, the second voltage is higher than the first voltage by about 1 V. Such a fixed amount by which the nominal voltage of the power supply unit is changed is technically easy to implement and is usually sufficient to be able to make statements after the measurement of the second value of the voltage drop as to whether the measured first value of the voltage drop was below the first threshold value merely due to an externally applied voltage or actually due to a defective field effect transistor.

In an alternative method, the second voltage is higher than a measured voltage at output terminals of the power supply device by approximately the second threshold value. Under these measurement conditions, a correct transfer of the current to the intrinsic or external parallel diode can be reliably detected.

In a further advantageous design, the measurement of the two voltage drops and their evaluation is carried out repeatedly in order to reliably detect a possible defect of the transistor. It can be provided that a defect of the at least one field effect transistor is only signaled when it is detected in a predetermined number of repetitions, for example only after three or more repetitions. In this way, a high positive certainty for defect detection is achieved.

Preferably, there is a waiting time between two successive repetitions of the method which, in particular with regard to its length, includes a random component. The random component can be calculated, for example, on the basis of an individual identifier of the power supply device, in particular a serial number.

The random component prevents that in the case of at least two identical power supply devices connected in parallel on the output side, a defect of the field effect transistor is supposedly detected because the two power supply devices carry out the method described above and accordingly change their nominal voltage for the measurement of the second voltage drop exactly synchronously during the execution of this method. This case is not improbable if two identical power supply devices are redundantly connected together on the output side, but also on the input side, and are supplied with input voltage at the same time, i.e. are switched on simultaneously. With a simultaneous start of the power supply devices, the method according to the application also initially runs synchronously. The random component prevents the power supply devices from performing their measurements with the same time structure when the measurement is repeated.

A power supply device of the type mentioned above according to the invention is characterized by a control unit which is set up to carry out the method described above. The advantages described in connection with the method are obtained. The control unit carrying out the method can thereby be part of a control device of the power supply unit.

The at least one field effect transistor is part of an ORing module, wherein the power supply unit and the ORing module can be arranged in separate housings or also in a common housing.

BRIEF DESCRIPTION OF THE FIGURES

The invention is explained in more detail below by means of exemplary embodiments with the aid of figures, wherein.

DETAILED DESCRIPTION

Figure 1:
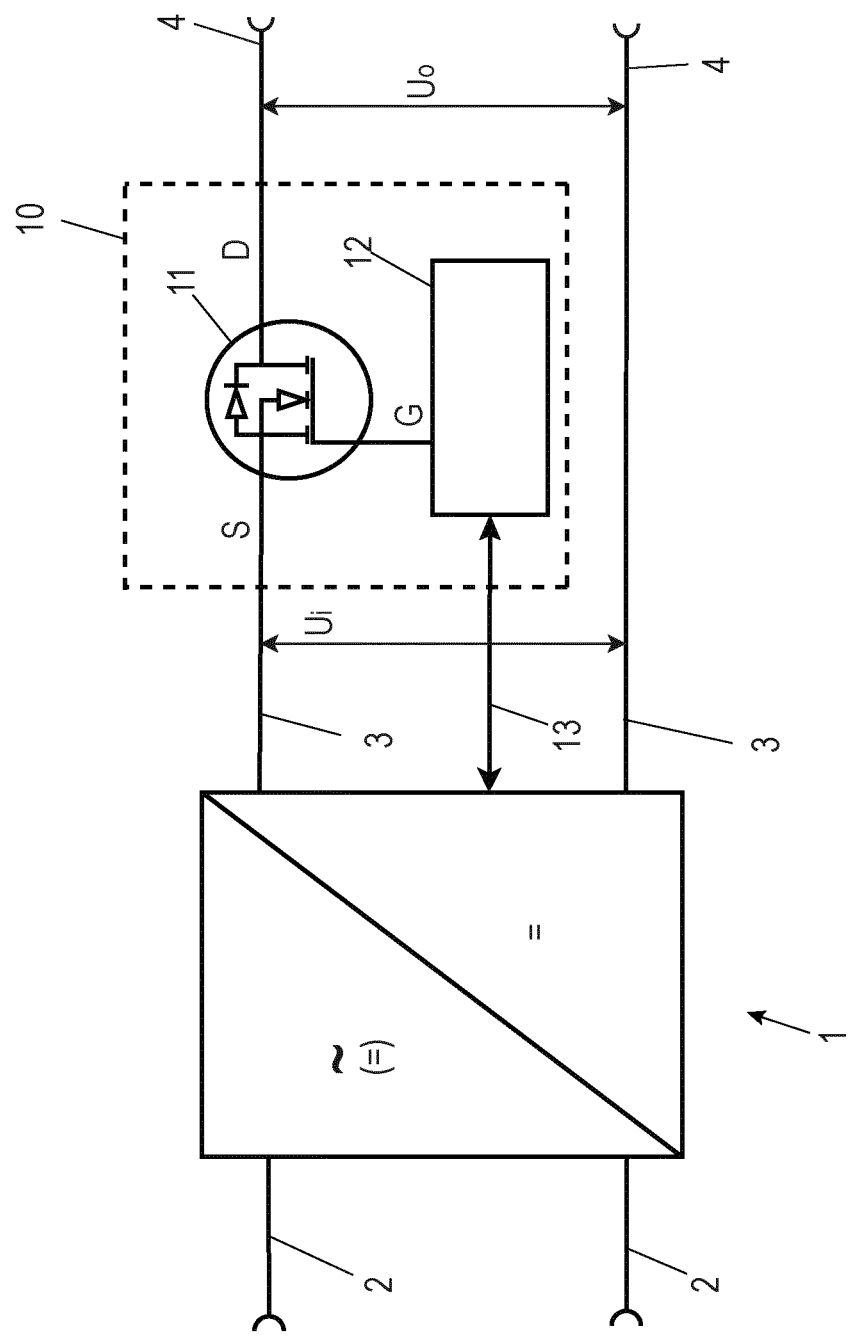
FIG. 1 is a schematic block diagram of a power supply device.

FIG. 1 is a block diagram of a power supply device including a power supply unit 1 and an ORing module 10. It is noted that the two units, the power supply unit 1 and the ORing module 10, can be arranged both integrated in a housing of the power supply device and in separate housings.

The power supply unit 1 converts an input voltage into an output voltage, wherein the input voltage can be DC and/or AC voltage, depending on the model. Frequently, a light main AC voltage is used as the input voltage. In that case, the power supply unit 1 is also referred to as a main power supply unit. The output voltage is a DC output voltage usually regulated to a predetermined value, the so-called nominal voltage. In a regular operation of the power supply unit 1, the output voltage deviates significantly in magnitude from the nominal voltage only when an output current of the power supply unit exceeds a maximum value.

The power supply device has input terminals 2, which also represent the inputs of the power supply unit 1 and via which an input current for the power supply unit 1 is supplied. In the present example, there are two input terminals 2, since the power supply unit 1 is supplied on the input side, for example, by single-phase alternating current. The number of input terminals 2 can also be greater than two, for example when the power supply unit is connected to a 3-phase AC main supply.

The output voltage of the power supply unit 1 is available at an output 3, which has two poles. The power supply device has output terminals 4 to which a load can be connected that is supplied by the power supply unit 1.

The ORing module 10 is connected between the power supply unit 1 and the output terminals 4, i.e. the load. The ORing module includes a field effect transistor 11, hereinafter referred to as FET 11, across whose switching path (i.e. between a source terminal S and a drain terminal D) the entire load current flows. In the illustrated exemplary embodiment, the FET 11 is an n-channel enhancement type that is blocking without driving. In principle, it is also possible to use other types or combinations of one or more field effect transistors.

In the example shown, the negative output of the power supply unit 1 is directly connected to the negative output terminal 4 of the power supply device, whereas the positive output 3 is connected to the positive output terminal 4 of the power supply device via the FET 11. In alternative designs, the positive output terminal 4 may be directly connected to the power supply unit 1 and the negative output terminal 4 may be connected via the field effect transistor. In this case, threshold values with adjusted levels may have to be used.

The ORing module 10 has a control unit 12 which controls the FET 11 via its gate input G. To ensure the ORing function of the ORing module 10, the control unit 12 compares the voltages at the output terminal 4 with the voltages at the output 3 of the power supply unit 1 for this purpose. These voltages are shown in FIG. 1 as $U_I$ and $U_o$. The voltage $U_I$ represents the output voltage of the power supply unit 1 and thus the input voltage for the ORing module. The voltage $U_o$ is the voltage applied to the output terminals 4. If the voltage $U_o$ becomes greater than the voltage $U_I$, the control unit 12 disables the FET 11 to prevent current from flowing back from the output terminals 4 into the power supply unit 1. Corresponding test leads leading to the control unit 12 are not shown in FIG. 1 for simplicity.

In the circuit symbol of FET 11, a diode is drawn between the source terminal S and the drain terminal D of FET 11. This diode is also known as a body diode and is intrinsic to field effect transistors. The diode is oriented in such a way that the FET 11 has an ORing function even without driving its gate terminal G, but then with the silicon diode-typical voltage drop of about 0.7 volts and not with the advantageous smaller voltage drop that can be achieved with a conductively connected FET 11.

In addition to driving the gate of the FET 11, the control unit 12 in the illustrated exemplary embodiment has a control terminal 13 which is coupled to the power supply unit 1 and via which the output voltage $U_I$ of the power supply unit 1 can be varied. This functionality is used as part of the test method described below. Also, in an alternative design, it is conceivable that the control unit 12 arranged in the ORing module 10 performs the driving of the FET 11 with respect to the ORing function, wherein the control terminal 13 makes it possible to influence the switching state of the FET 11 independently thereof in the context of the test method described below. It is noted that, in particular when the ORing module 10 is integrated together with the power supply unit 1, the function of the control unit 12 can also be fully or partially performed by a control unit of the power supply unit 1.

Figure 2:
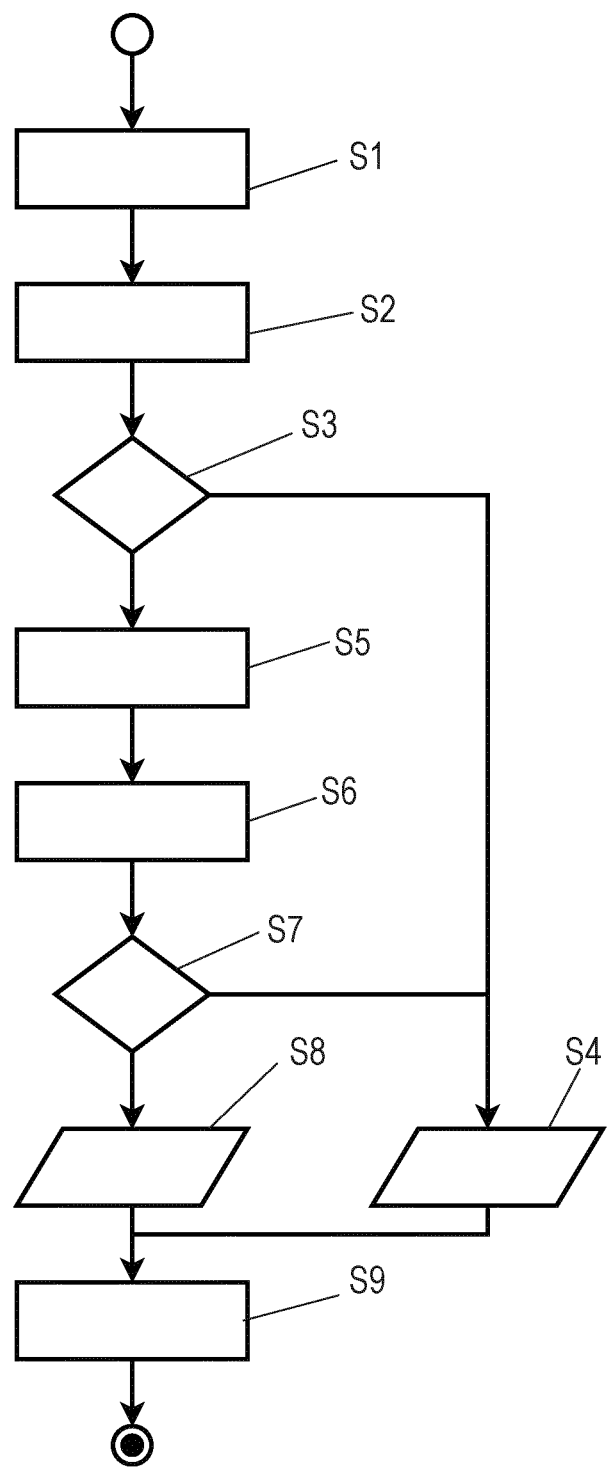
FIG. 2 is a flowchart of a first exemplary embodiment of a test method for testing an ORing field effect transistor.

FIG. 2 shows an exemplary embodiment of a method for checking the functionality of a field effect transistor used as an active diode in an ORing module in the form of a flow chart. The method can be carried out, for example, in the power supply device according to FIG. 1 and is explained by way of example using the structure according to FIG. 1 and the reference signs shown there.

It is assumed that when the method is carried out, the power supply unit 1 is in regular operation and provides a preset voltage, the nominal voltage, as voltage $U_I$ at its output 3. The method does not assume any further prerequisite. In particular, the power supply device to be checked may be operated without a load or may operate a load alone or in a parallel connection with at least one other power supply device. When the power supply device is actively involved in supplying the load with a current flow, the FET 11 of the ORing module 10 is conductively driven by the control unit 12 via the gate terminal G. In an alternative design of the method, this can also be interrogated in advance by appropriate measurements.

In a first step S1 of the method, the FET 11 is brought into a blocked state, for example by the gate terminal G no longer being driven by the control unit 12. This can be achieved directly by appropriate drive logic within the control unit 12. If the power supply device is operated in a parallel connection, a blocking state of the FET 11 can also be achieved by lowering the nominal voltage of the power supply unit 1 by, for example, one or more volts, whereby the ORing module 10 detects an operating situation in which the field effect transistor 11 is blocked in order to avoid reverse currents. In that case, the control unit 12 disables the FET 11 by its Oring functionality.

In a subsequent step S2, a voltage $\Delta U = U_I - U_o$ dropping across the switching path (source-drain path) of the FET 11 is determined, for example from measuring the individual voltages $U_I$ and $U_o$. $\Delta U$ is subsequently referred to as the voltage difference or voltage drop.

Then, in a next step S3, it is checked whether the magnitude $|\Delta U|$ of the measured voltage difference $\Delta U$ is greater than or equal to a first positive threshold value $U_1$, which is in the range of about 0.3 volts. If so, the turning off of FET 11 has caused the load current to now flow across the body diode of FET 11, which is associated with a corresponding voltage drop, or the body diode is preventing current flow into the power supply unit 1. However, this is an indication that the actual switching path of the FET 11 is functional and, in particular, does not exhibit any short-circuit behavior, which it would do after the FET 11 has melted through (also called shorting).

If $|\Delta U| >= U_1$ is detected for the magnitude, the method therefore branches to a step S4 in which it is indicated that the FET 11 is functional. The method then continues with a step S9 in which the field effect transistor 11 is made conductive again so that its switching path carries the load current with correspondingly low loss.

If it is determined in step S3 that the measured voltage difference $\Delta U$ is smaller in magnitude than the specified first threshold value $U_1$, no statement can initially be made about the correct function of the FET 11. According to the invention, in a subsequent step S5, the nominal voltage of the power supply unit 1 and thus the output voltage of the power supply unit $U_I$ is changed, for example via the control output 13, by a certain amount and in particular raised, for example by one volt.

After an optional waiting time, which the power supply unit 1 requires in order to be able to correctly provide the requested changed output voltage $U_I$, the measurement of step S2 is repeated in a step S6, i.e. the voltage difference ΔU across the switching distance of the FET 11 is determined again. Thereupon, it is checked again whether this voltage difference is greater than the predetermined positive first threshold value $U_1$. If this is the case, the method branches again to step S4 to signal the correct function of FET 11.

The background is that the difference in the result of the measurements in steps S2 and S6 shows that a transition of the current to the body diode did not occur in steps S2/S3 because at the output the voltage Ur was maintained externally, e.g. by a further power supply device connected in parallel. However, after raising the nominal voltage, the output voltages of the involved power supply device differ. If the FET 11 has switched off correctly and the load current is commutated to the body diode, this is reflected in a voltage difference ΔU which is not smaller in magnitude to the first threshold value, which is why the method branches to step S4 in this case.

However, if in step S6 no differential voltage ΔU above the first threshold value could be determined despite the increased nominal voltage, i.e. no current is transferred to the body diode despite the increase in the nominal voltage, this indicates a short circuit in the switching path of the field effect transistor 11, which must accordingly be regarded as defective. This is signaled in a subsequent step S8 after evaluation of the differential voltage ΔU in step 37.

In the following step S8, in addition to signaling a defective FET, the nominal voltage of the power supply unit 1 is reset to the previous nominal voltage that was set at the beginning of the method, and the method is terminated with step S9, in which the field effect transistor 11 is again driven.

The signaling specified in step S8 can be displayed, for example, in the form of a signal indicator, e.g., a corresponding light-emitting diode, on the ORing module 10 or the power supply device. Alternatively, a dispatch of a data message via a communication network to which the power supply device is connected can also be regarded as signaling.

With a corresponding design of the method, steps S1 to S8 can advantageously be carried out in a time of a few milliseconds (ms) to a maximum of 10 ms. This is advantageous if the power supply device is used to supply industrial equipment. These are often designed according to the IEC 61131-2 standard, which requires that the devices must function without restriction for a period of 10 ms even without a power supply Consequently, if the described test cycle runs faster than the specified 10 ms, it has no influence on the functionality of the connected devices.

Accordingly, it may be advantageous to provide a smooth transition of steps S1 to S8 without waiting times and/or to consider an expected rise ramp of the output voltage $U_I$ of the power supply unit 1 according to its time response.

Figure 3:
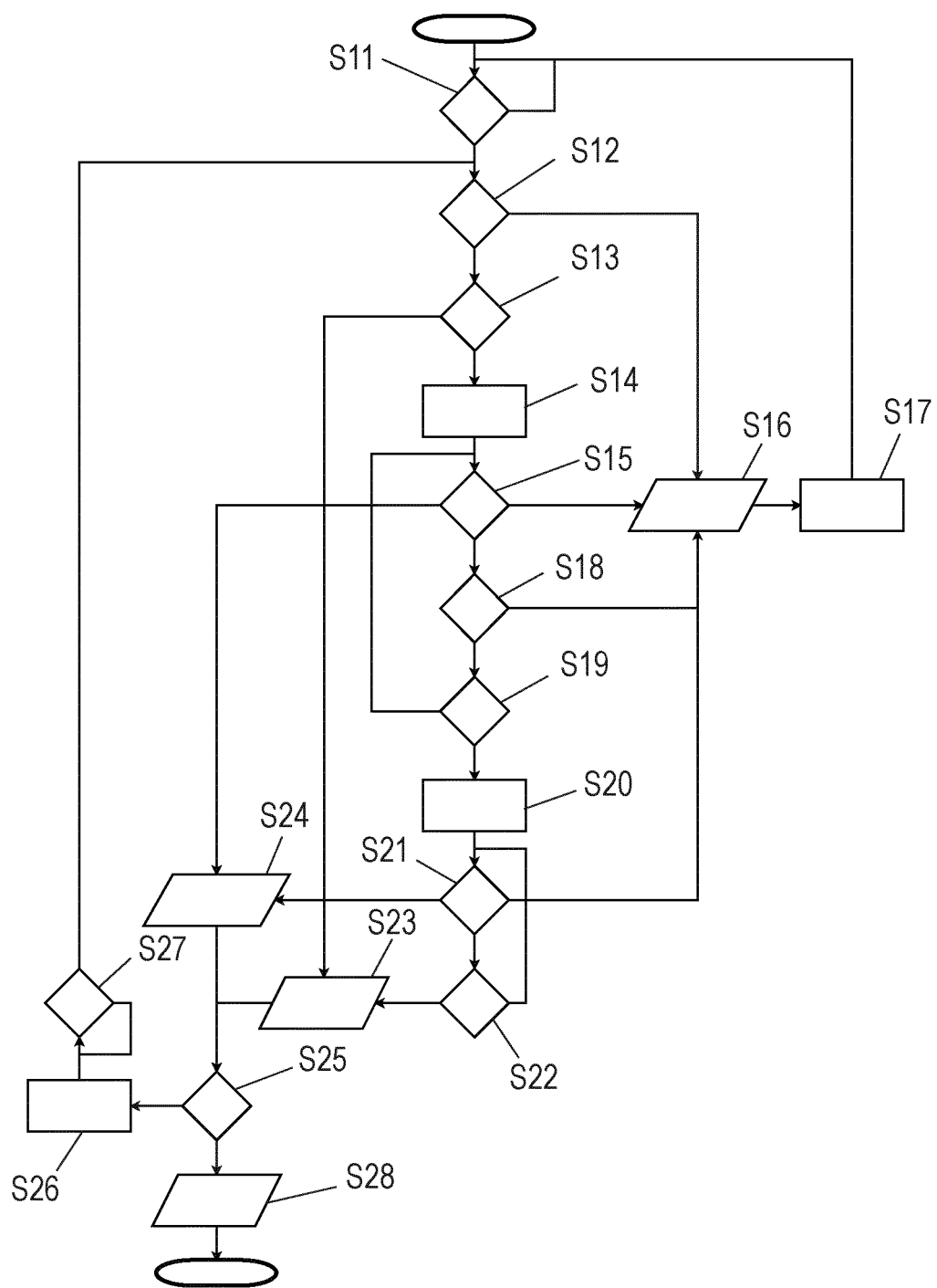
FIG. 3 is a flowchart of a second exemplary embodiment of a monitoring method for an ORing field effect transistor.

FIG. 3 shows another exemplary embodiment of a test method for a field effect transistor of an ORing module, also in the form of a flow chart. Again, the flowchart is explained with reference to the power supply device shown schematically in FIG. 1.

Also as explained in connection with FIG. 2, the method starts on the condition that the power supply unit 1 is set to a predetermined nominal voltage which is applied to the output 3 of the power supply unit 1.

In order to be able to start the method with the switching on of the power supply device, a certain start delay is initially implemented via a loop structure in step S11. Only after a predefined time $T > T_{Start}$ has elapsed will the method be continued with a step S12. The start delay by the time $T_{Start}$ enables, for example, the power supply unit 1 to start up and assume its stable operation if it has only just been switched on.

In step S12, the voltages $U_I$ and $U_o$ are measured upstream and downstream of the ORing module 10, respectively, and it is checked whether the voltage at the output 4 of the power supply device is greater than at the output of the power supply unit 1, even taking into account a measurement inaccuracy of, for example, 0.05 V. In relation to the voltage difference $\Delta U = U_I - U_o$, it is therefore checked whether $|\Delta U| > 0.05$ V. This can result, for example, from a further power supply unit connected in parallel, which has a slightly increased output voltage despite being set to the same high nominal voltage. This can be caused, for example, by a further power supply unit connected in parallel, which has a slightly higher output voltage despite the nominal voltage being set to the same level. However, the fact that the voltage $U_o$ is greater than $U_I$ already shows that the FET 11 does not have a short circuit. The method then branches to a step S16 in which the FET 11 is considered functional.

From step S16 the method is continued in step S17, in which the FET 11 is switched on again if necessary and a time memory variable is set to the value zero again. The method then branches back to step S11, in which the waiting time $T_{Start}$ is again waited for until step S12 is processed again. Accordingly, a repetition frequency for the method can also be defined via the time $T_{Start}$.

If in step S12 the condition is not satisfied, for example, if the voltage at output 3 is exactly the same as that at output terminals 4, the method branches to a step S13 in which it is checked whether the voltage $U_I$ is greater than the set nominal voltage of power supply unit 1. If this is so, it is an indication that the power supply device has a higher voltage applied to its output terminals 4 and this is also found at output 3 of power supply unit 1. This is an indication of a short circuit in the FET 11, which is why the method branches to a step S23 in which a variable used to count a number of detected fault cases is incremented by the value 1 and a time at which the test has taken place is stored in a variable $T_{test}$.

After a detected fault in step S23, the method branches to a step S25, in which it is checked whether a certain number of fault cases, for example three, has been reached. If not, the program branches to a next step S26, in which the FET 11 is switched on again (if it was previously switched off), in which the test time is stored (if necessary again) in a variable $T_{Test}$ and in which (optionally) the voltage at output 3 of the power supply unit 1 is reset to the nominal value.

Thereupon, in a next step S27, a waiting loop is executed by which the method branches again to step S12 only after a certain waiting time has elapsed. The meaning of this waiting time in step S27 is explained in more detail below.

If the condition in step S13 was not met, the method continues with a step S14 in which the FET 11 is switched off. The time at which this happens is again stored as a test time, and the current flowing before the shutdown is also stored. The current value is typically available within the power supply unit 1, as it is measured by the power supply unit 1 as part of an overcurrent protection circuit. Turning off the FET 11 in step S14 corresponds to turning off the field effect transistor in step S1 of the exemplary embodiment of FIG. 2.

In a subsequent step S15, the voltage ΔU dropping across the FET 11 is measured and evaluated. Three cases are distinguished in the present exemplary embodiment: In a first case, the voltage at the output terminals 4 is lower than the voltage at the output 3 of the power supply unit 1 by more than a predetermined voltage value, i.e. ΔU>$U_2$, wherein $U_2$ is a positive value of some volts, for example 2 V. If this condition is met, it means that the FET 11 is blocking and also its body diode is not conducting. This is a rare but possible fault condition that is detected and counted in a step S24. After step S24, this error is dealt with in steps S25+ in the same way as for a short-circuit error of FET 11 in step S23.

Another case that may occur in step S15 is that the magnitude of the voltage difference ΔU is less than or equal to the further threshold $U_2$ but greater than or equal in magnitude to the positive first threshold $U_1$ of about 0.3 V that was also the subject of the interrogation in step 3 in FIG. 2. In that case, the method branches to step S16, in which the field effect transistor 11 is considered functional. The method then comes to a new run via step S17 and step S11 after the waiting time $T_{Start}$.

In the third case of step S15, the magnitude of the voltage difference ΔU is smaller than the first threshold value $U_1$, i.e. |ΔU|<$U_1$, whereupon the method continues with step S18.

In step S18, the current flowing at the output of the power supply unit 1 is again determined. If it is determined that the current was greater than a predetermined threshold before the FET 11 was switched off in step S14, but has now dropped to zero, this also indicates correct operation and in particular correct switching off of the source-drain path of the field effect transistor. In this case, the method also branches to step S16, in which the FET 11 is considered functional.

If the condition in step S18 was not fulfilled, this may be due to a too short time between step S14 and step S18, which for example falsifies the result of the current measurement in step S18 Therefore, until a minimum waiting time is reached, the method branches back to a step S19 to run through steps S15 and S18 again to again have the possibility that the FET 11 is considered functional in step S16. If this is not the case even after repeated run-through and it is determined in step S19 that the turn-off time of the FET 11 in step S14 was sufficiently long in the past so that correct measurements can be assumed, even taking into account time constants of the measurements of steps S15 and S18, the method branches to a step S20.

In step S20, the voltage at output 3 of power supply unit 1 is increased by a predetermined amount, for example by one volt again. This is followed by steps S21 and S22, which are analogous to steps S15 and S19: In step S21, three different cases are again distinguished for the voltage difference ΔU, which correspond exactly to the distinctions in step S15. In the first case described there (ΔU>$U_2$), the method branches to step S24 and in the second case described there ($U_1$<|ΔU|<=$U_2$) to step S16. After sufficient waiting time, in the third case. i.e. the case where both the measurement in step S15 and the measurement in step S22 have resulted in a voltage difference below the first threshold (ΔU<$U_1$), the method branches to step S23, where a short circuit of FET 11 is diagnosed and counted as a fault.

If it is then determined in step S25 that this error condition reproducibly occurs more frequently, for example more than twice, then this error is also signaled to the outside in a step S28. This ends the method.

After the fault has been detected in step S23, starting from step S22, there is in principle still the possibility that a fault has been detected only because a second parallel-connected power supply, which is equipped with the same fault detection according to the invention for its field effect transistor of an ORing module, is being run through and has correspondingly raised its nominal voltage in step S20 exactly synchronously with the running of this method. In that case, both power supply devices would measure a voltage difference of ΔU<$U_1$ in their respective methods in step S15 and step S21.

This case is not unlikely if two identical power supply devices are connected together redundantly on the output side but also on the input side and are supplied with input voltage at the same time, i.e. are switched on simultaneously. With a simultaneous start of the power supply devices, the monitoring methods also start synchronously.

In order to prevent that both power supply devices again perform their measurements with the same time structure when the measurement is repeated, the waiting time already mentioned is provided with a random component in step S27.

Preferably, this random component is not purely computational (quasi-random), but uses different properties of the power supplies in its algorithm, for example their serial number, which is individual for each power supply. Also, states of the least significant bits of analog-to-digital converters can be used as true random components within an algorithm for a random number generator.

The invention claimed is:

1. A method for checking at least one field effect transistor connected as an active diode, downstream of an output of a power supply unit within a power supply device, comprising the steps of:
   (a) generating a blocking state of the at least one field effect transistor;
   (b) detecting a first value of a voltage drop across a switching path of the at least one field effect transistor at a first set voltage of the power supply unit;
   (c) setting a second voltage of the power supply unit;
   (d) detecting a second value of the voltage drop across the switching path of the at least one field effect transistor at the second set voltage of the power supply unit; and
   (e) detecting and signaling a defect of the at least one field effect transistor if the first value of the voltage drop and the second value of the voltage drop are both smaller in magnitude than a predetermined first positive threshold value, or if the first value of the voltage drop and/or the second value of the voltage drop are larger than a predetermined second positive threshold value, wherein the second threshold value is larger than the first threshold value.

2. The method according to claim 1, in which the first threshold value is at least 0.3 volts.

3. The method according to claim 1, in which the second threshold value is at least 1.5 volts.

4. The method according to claim 3, wherein the second threshold value is at least 2 volts.

5. The method according to claim 1, wherein the second voltage is higher than the first voltage by at least 1 volt.

6. The method according to claim 1, wherein the second voltage is higher than a measured voltage at output terminals of the power supply device by at least the second threshold value.

7. The method according to claim 1, in which said steps are performed repeatedly.

8. The method according to claim 7, in which a defect of the at least one field effect transistor is not signaled until it is detected in a predetermined number of repetitions.

9. The method according to claim 8, wherein the predetermined number of repetitions after which a defect is also signaled is at least three.

10. The method according to claim 7, wherein there is a waiting period between two successive repetitions of the method steps.

11. The method according to claim 10, wherein the waiting time comprises a random component.

12. The method according to claim 11, wherein the random component is calculated based on an individual identifier of the power supply device.

13. A power supply device, comprising
(a) a power supply unit;
(b) at least one field effect transistor switched as an active diode connected with an output of said power supply unit; and
(c) a control unit connected with said power supply unit and said at least one field effect transducer, said control unit
(1) generating a blocking state of said at least one field effect transistor;
(2) detecting a first value of a voltage drop across a switching path of the at least one field effect transistor at a first set voltage of the power supply unit;
(3) setting a second voltage of said power supply unit;
(4) detecting a second value of the voltage drop across the switching path of said at least one field effect transistor at the second set voltage of said power supply unit; and
(5) detecting and signaling a defect of said at least one field effect transistor if the first value of the voltage drop and the second value of the voltage drop are both smaller in magnitude than a predetermined first positive threshold value, or if the first value of the voltage drop and/or the second value of the voltage drop are larger than a predetermined second positive threshold value, wherein the second threshold value is larger than the first threshold value.

14. A power supply device according to claim 13, wherein said at least one field effect transistor is part of an ORing module.

15. A power supply device according to claim 14, wherein said power supply unit and said ORing module are arranged in separate housings.

16. A power supply device according to claim 14, wherein said power supply unit and said ORing module are arranged in a common housing.

17. A power supply device according to claim 16, wherein said control unit is part of a control device of said power supply unit.

* * * * *